United States Patent
Kim

(10) Patent No.: US 8,154,702 B2
(45) Date of Patent: Apr. 10, 2012

(54) LIQUID CRYSTAL DISPLAY DEVICE

(75) Inventor: Sung Woo Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 336 days.

(21) Appl. No.: 12/498,146

(22) Filed: Jul. 6, 2009

(65) Prior Publication Data

US 2010/0007817 A1 Jan. 14, 2010

(30) Foreign Application Priority Data

Jul. 8, 2008 (KR) .................. 10-2008-0065930

(51) Int. Cl.
*G02F 1/1345* (2006.01)
(52) U.S. Cl. ............ 349/150; 349/58; 349/65; 362/631; 362/612; 362/633
(58) Field of Classification Search .......... 349/150, 349/65, 58, 60; 362/612, 97.2, 631, 633, 362/634
See application file for complete search history.

(56) References Cited

U.S. PATENT DOCUMENTS

| | | | | |
|---|---|---|---|---|
| 6,930,737 B2 * | 8/2005 | Weindorf et al. | | 349/96 |
| 7,607,815 B2 * | 10/2009 | Pang | | 362/612 |
| 7,924,388 B2 * | 4/2011 | Abe | | 349/150 |
| 2007/0052662 A1 * | 3/2007 | Kim et al. | | 345/102 |
| 2008/0074853 A1 * | 3/2008 | Jang et al. | | 361/749 |

FOREIGN PATENT DOCUMENTS

| | | |
|---|---|---|
| CN | 1735835 | 2/2006 |
| CN | 1773350 | 5/2006 |

* cited by examiner

*Primary Examiner* — Thoi Duong
(74) *Attorney, Agent, or Firm* — Morgan, Lewis & Bockius LLP

(57) ABSTRACT

The present invention relates to a liquid crystal display device having an LED flexible substrate which requires no bonding by making a simple structural change. The liquid crystal display device includes a liquid crystal display panel, an LED for providing a light to the liquid crystal display panel, and an LED flexible substrate having a seating portion for mounting the LED thereto, and first and second flat portions bent from the seating portion perpendicular thereto respectively, to form a flexible printed circuit (FPC).

9 Claims, 7 Drawing Sheets

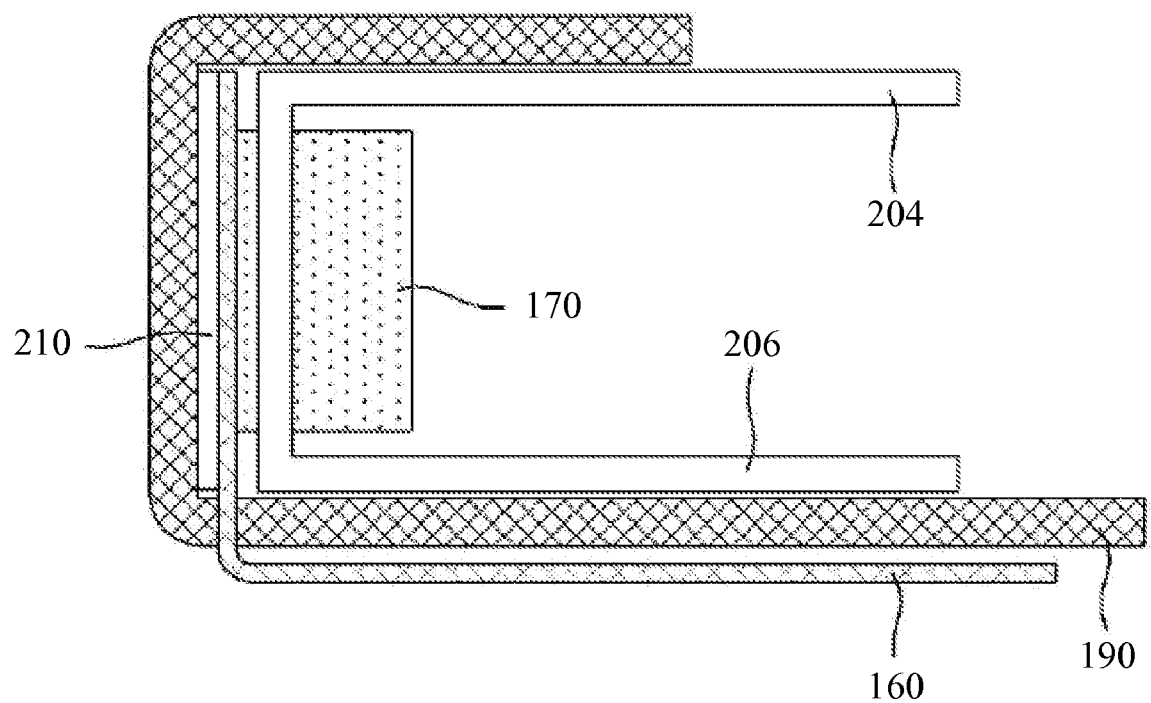

LIQUID CRYSTAL DISPLAY DEVICE

CROSS REFERENCE TO RELATED APPLICATION

This application claims the benefit of the Patent Korean Application No. 10-2008-065930, filed on Jul. 8, 2008, which is hereby incorporated by reference as if fully set forth herein.

BACKGROUND OF THE DISCLOSURE

1. Field of the Disclosure

The present invention relates to a liquid crystal display device having an LED flexible substrate which requires no bonding by making a simple structural change.

2. Discussion of the Related Art

It is a trend that a range of application of the liquid crystal display devices becomes the greater gradually owing to features of light weight, thin, and low power consumption of the liquid crystal display device. The liquid crystal display device is provided with a liquid crystal display module, and a driving circuit unit for driving the display module.

The liquid crystal display module is provided with a liquid crystal display panel having a matrix of liquid crystal cells between two transparent substrates, and a back light assembly for directing a light to the liquid crystal display panel.

The back light assembly is provided with an LED for directing the light to the liquid crystal display panel, an LED circuit board having the LED mounted thereto, a light guide plate for guiding the light from the LED toward the liquid crystal display panel, a reflective sheet on a back side of the light guide plate, and a plurality of optical sheets stacked on the light guide plate.

In this instance, the LED circuit board is a Hard-PCB (Printed Circuit Board), bonded and connected to an FPC (Flexible Printed Circuit) for having power supplied therefrom. The bonding for connection between the LED circuit board and the FPC can cause short between lines, and defect, such as making the Hard-PCB thicker, and requires additional cost for the bonding. Moreover, if the LED circuit board is the Hard-PCB, a width of the LED circuit board is limited and it is difficult to make a width of line thin, resulting to fabricate a multi-layered circuit board.

SUMMARY OF THE DISCLOSURE

Accordingly, the present invention is directed to a liquid crystal display device.

An object of the present invention is to provide a liquid crystal display device having an LED flexible printed circuit which requires no bonding by a simple structural change.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device includes a liquid crystal display panel, an LED for providing a light to the liquid crystal display panel, and an LED flexible substrate having a seating portion for mounting the LED thereto, and first and second flat portions bent from the seating portion perpendicular thereto respectively, to form a flexible printed circuit (FPC).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 7 illustrates a section of a light source unit in accordance with a second preferred embodiment of the present invention.

DESCRIPTION OF SPECIFIC EMBODIMENTS

Reference will now be made in detail to the specific embodiments of the present invention, examples of which are illustrated in the accompanying drawings FIGS. 1 to 8C. Wherever possible, the same reference numbers will be used throughout the drawings to refer to the same or like parts.

Figure 1:
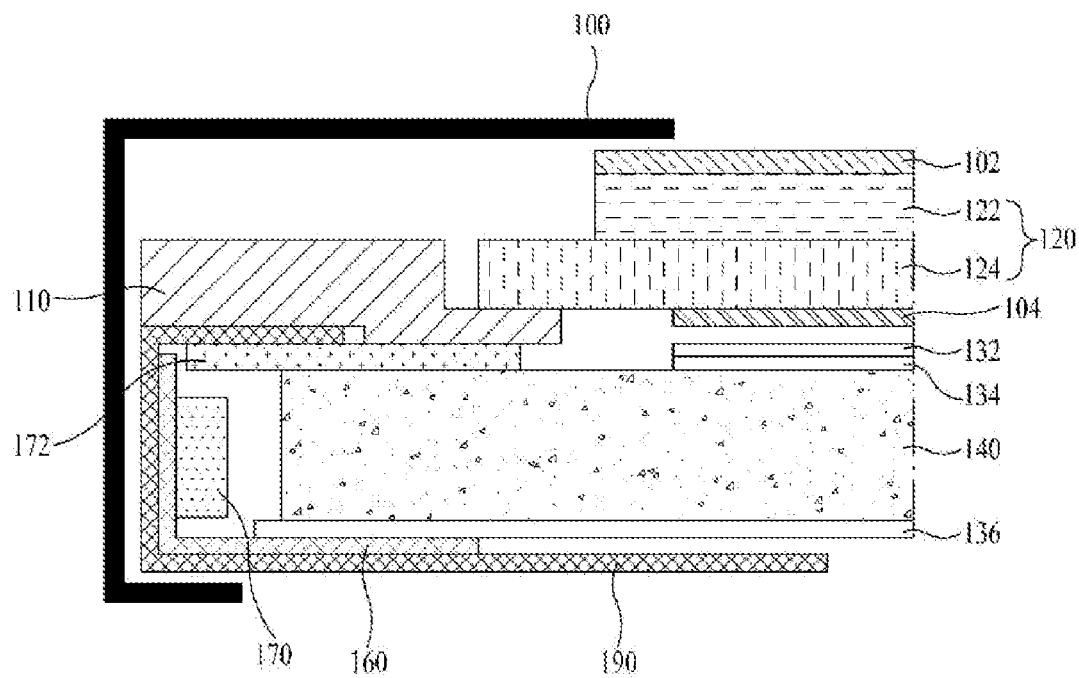
FIG. 1 illustrates a section of a liquid crystal display device in accordance with a first preferred embodiment of the present invention.
Figure 2:
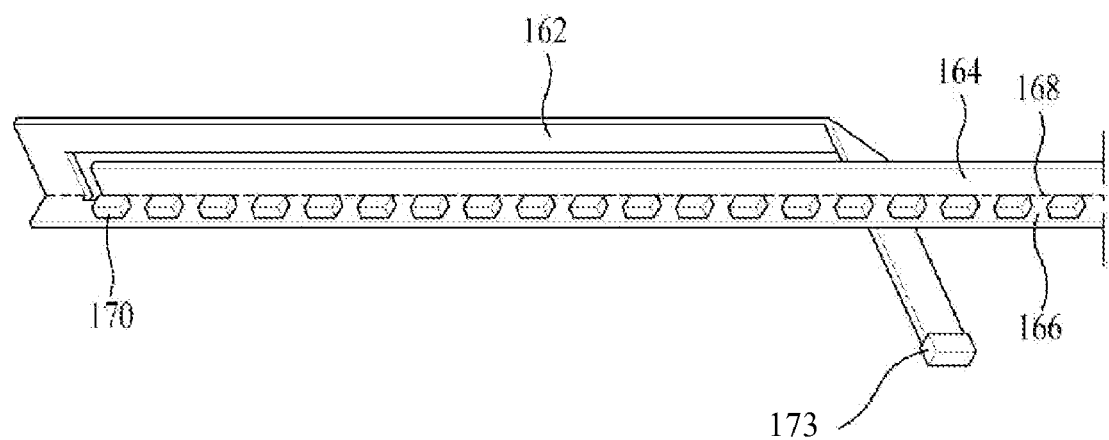
FIG. 2 illustrates a perspective view of the LED flexible printed circuit in FIG. 1.
Figure 3:
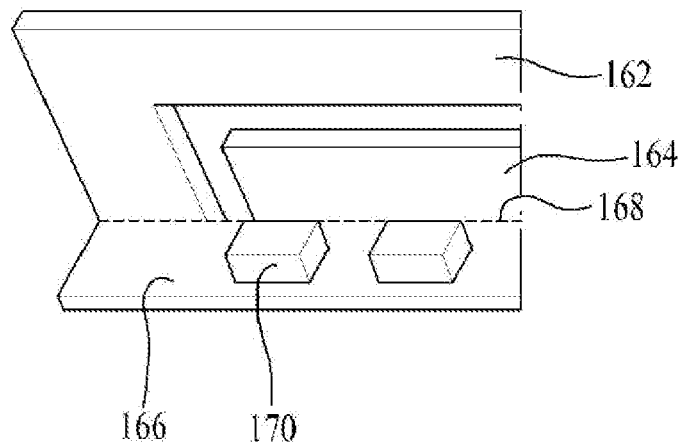
FIG. 3 illustrates an enlarged view of the LED flexible printed circuit in FIG. 1.

FIG. 1 illustrates a section of a liquid crystal display device in accordance with a first preferred embodiment of the present invention, FIG. 2 illustrates a perspective view of the LED flexible printed circuit in FIG. 1, and FIG. 3 illustrates an enlarged view of the LED flexible printed circuit in FIG. 1.

Referring to FIG. 1, the liquid crystal display device includes a liquid crystal display panel for displaying an image, a back light assembly for providing a light to the liquid crystal display panel 120, a mold frame 110 for fixedly securing the back light assembly and mounting the liquid crystal display panel 120 thereto, and a top chassis 100 and a bottom chassis 190 for housing or surrounding the liquid crystal display panel 120 and the back light assembly.

The liquid crystal display panel 120 includes a color filter substrate 122 and a thin film transistor substrate 124 bonded to face each other with liquid crystals disposed therebetween. In this instance, the liquid crystal display panel 120 may have an upper polarization film placed on an upper side thereof and a lower polarization film placed on a lower side thereof.

The color filter substrate 122 have a black matrix for shielding leakage of a light, a color filter for producing a color, a common electrode for forming a vertical electric field with a pixel electrode, and an upper alignment film formed thereon for alignment of liquid crystals.

The thin film transistor substrates 124 have a plurality of gate lines and data lines formed to cross each other, a thin film transistor formed at every cross portion of the gate lines and data lines, a pixel electrode connected to each of the thin film transistors, and a lower alignment film coated for alignment of the liquid crystals formed on above components.

The mold frame 110 receives and prevents the back light assembly from shaking, absorbs external impact applied to the liquid crystal display panel 120 and the back light assembly, and supports the liquid crystal display panel 120 placed thereon. The mold frame 110 formed of synthetic resin or plastic is favorable for insulating the driving circuit unit.

The top chassis 100 has first and second horizontal portions and a vertical portion. The first horizontal portion covers an edge of an upper surface of the liquid crystal display panel 120, the second horizontal portion covers an edge of a lower surface of the liquid crystal display panel 120, and the vertical portion covers a side of the mold frame 110 and the bottom chassis 190.

The top chassis 100 protects the liquid crystal display panel 120 and the back light assembly against an external impact, and prevents components positioned between the top chassis 100 and the bottom chassis 190 from falling off.

The bottom chassis 190 houses the back light assembly, and supports the back light assembly from below. The bottom chassis 190 has a C shape for surrounding the light source unit.

The back light assembly includes a light source unit for providing the light, a light guide plate 140 for guiding the light from the light source unit, reflective sheets 136, 172 for reflecting the light directed in an upper side and a lower side of the light guide plate 140 toward the light guide plate 140 again, and optical sheets 132, and 134 over the light guide plate 140 for distributing the light throughout the liquid crystal display panel uniformly, as well as converging the light.

The light guide plate 140 distributes the light from the LED 170 throughout a light guide plate 140 and guides the light toward the liquid crystal display panel 120. The light guide plate 140 is formed of polycarbonate which is transparent and heat resistant, or acryl resin which is transparent and has an excellent refractive index.

The reflective sheets 136 and 172 reflect the light directed in the upper side and the lower side of the light guide plate. The reflective sheets 136 and 172 have a reflective material having high reflectivity coated on a base material. The base material may be aluminum Al, PET (polyethylene terephtalate) or the like, and the reflective material may be silver Ag, titanium Ti, or the like. In order to enhance the reflectivity, the reflective sheet includes an upper reflective sheet 172 positioned on an upper side of the light guide plate 140, and a lower reflective sheet 136 positioned on an underside the light guide plate 140.

The optical sheets 132 and 134 on the upper side of the light guide plate 140 distribute the light to the liquid crystal display panel 120 and converges the light. The optical sheets 132 and 134 converges the light from the light guide plate 140 to the liquid crystal display panel 120 for improving light efficiency. For this, the optical sheet includes a diffusion sheet 134 and a prism sheet 132.

The diffusion sheet 134 directs the light from the light guide plate 140 to a front of the liquid crystal display panel 120, and diffuses the light so as to be distributed to a large area uniformly, to direct the light to the liquid crystal display panel 120. The prism sheet 132 changes an angle of advance of the light distributed by the diffusion sheet to be perpendicular to the liquid crystal display panel 120 for improving brightness and an angle of view. Moreover, a protective sheet may also be provided on the prism sheet 132 for protecting the prism sheet 132 which is susceptible to dusts and scratch, and preventing the sheets from moving during transportation of the back light assembly. By an appropriate combination of two to three sheets of the diffusion sheets and prism sheets 132, the brightness and the angle of view can be improved by diffusing or concentrating the light from the light guide plate 140.

The light source unit includes an LED 170, and an LED flexible substrate 160.

A plurality of the LEDs 170 are arranged on a line on the LED flexible substrate 160 to face the light guide plate 140 for providing the light to the liquid crystal display panel 120.

Referring to FIGS. 2 and 3, the LED flexible substrate 160 includes first and second flat portions 162 and 164, and a seating portion perpendicular to the first and second flat portions 162 and 164, to form a flexible printed circuit FPC. The seating portion 166 has a plurality of the LEDs 170 mounted on a line, the first flat portion 162 has an inverter connected thereto for having driving power applied thereto for driving the LEDs 170, and the second flat portion 164 has a line for LED driving signals and heat dissipation.

The LED flexible substrate 160 has the first and the second flat portions 162 and 164 and the seating portion 166 bent perpendicular to each other. A contact line between the first and second flat portions 162 and 164 and the seating portion 166 is half cut 168 for easy bending.

In detail, the first flat portion 162 is bent into a "C" shape and has a connector 173 for connection to the inverter. The second flat portion 164 is bent to have a length the same with the seating portion 166 having the plurality of LEDs 170 formed thereon. The first and second flat portions 162 and 164, not only form a driving signal, but also have a pattern of copper or the like for fast dissipation of heat from the LEDs 170.

Figure 4:
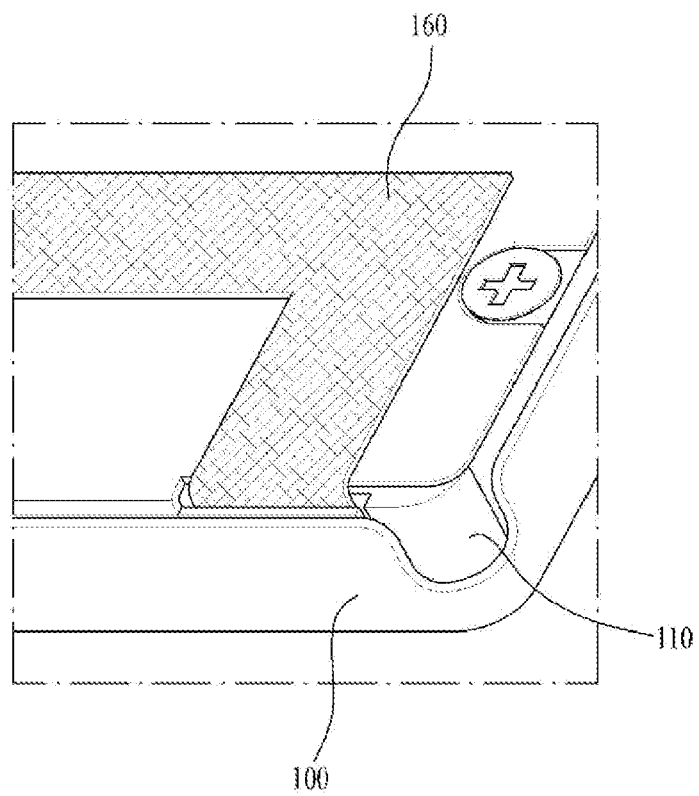
FIG. 4 illustrates a perspective view of the LED flexible printed circuit in FIG. 1, which is formed to lead outward.
Figure 5:
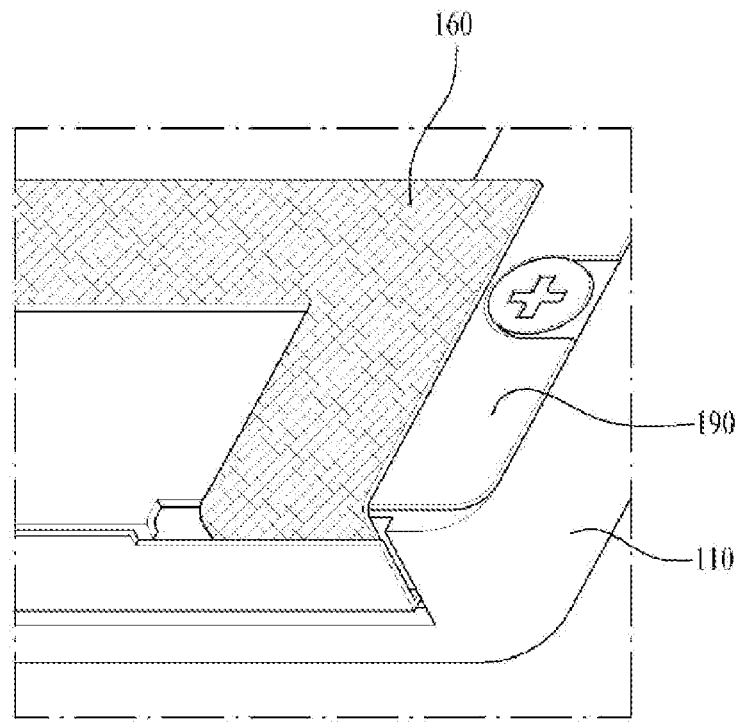
FIG. 5 illustrates a diagram of a module having a top chassis removed therefrom in accordance with a first preferred embodiment of the present invention.
Figure 6:
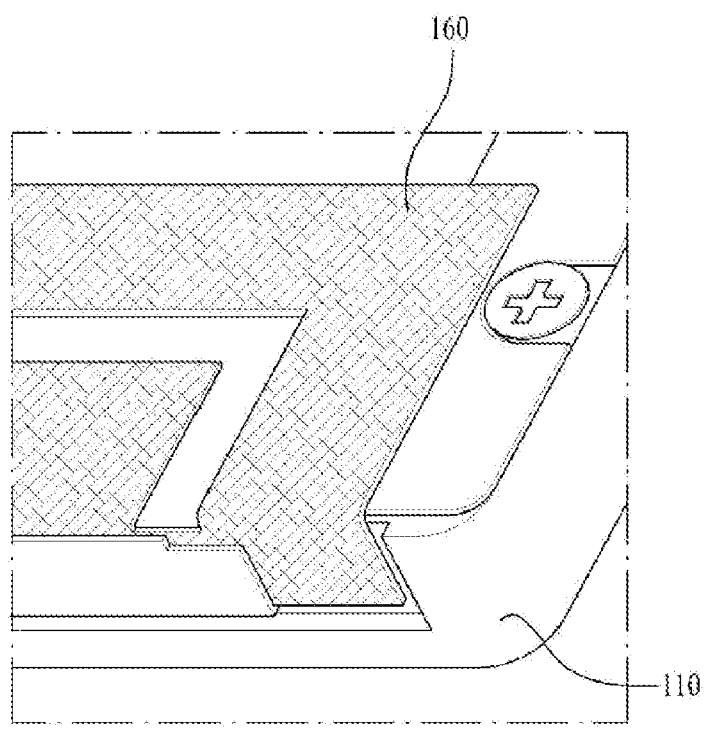
FIG. 6 illustrates a diagram of a module having a bottom chassis removed therefrom in accordance with a first preferred embodiment of the present invention.

Referring to FIG. 4, the mold frame 110 has a space for leading the first flat portion 162 to an outside for connection to the inverter. The bottom chassis 190 is formed to cover the seating portion 166 and the second flat portion 164. According to this, the seating portion can be prevented from being dented or scratched in a module assembly process. That is, FIG. 5 illustrates a diagram of the module having the top chassis 10 removed therefrom, and FIG. 6 illustrates a diagram of the module having a bottom chassis 190 removed therefrom, wherein it can be known that the bottom chassis 190 surrounds the seating portion 166 and the second flat portion 164.

The LED flexible substrate 160 may have a reflective material, such as silver or aluminum coated on an inside surface. According to this, the LED flexible substrate 160 reflects the light from the LED 170 toward a side of the light guide plate 140, thereby enhancing a light efficiency.

Figure 8A:
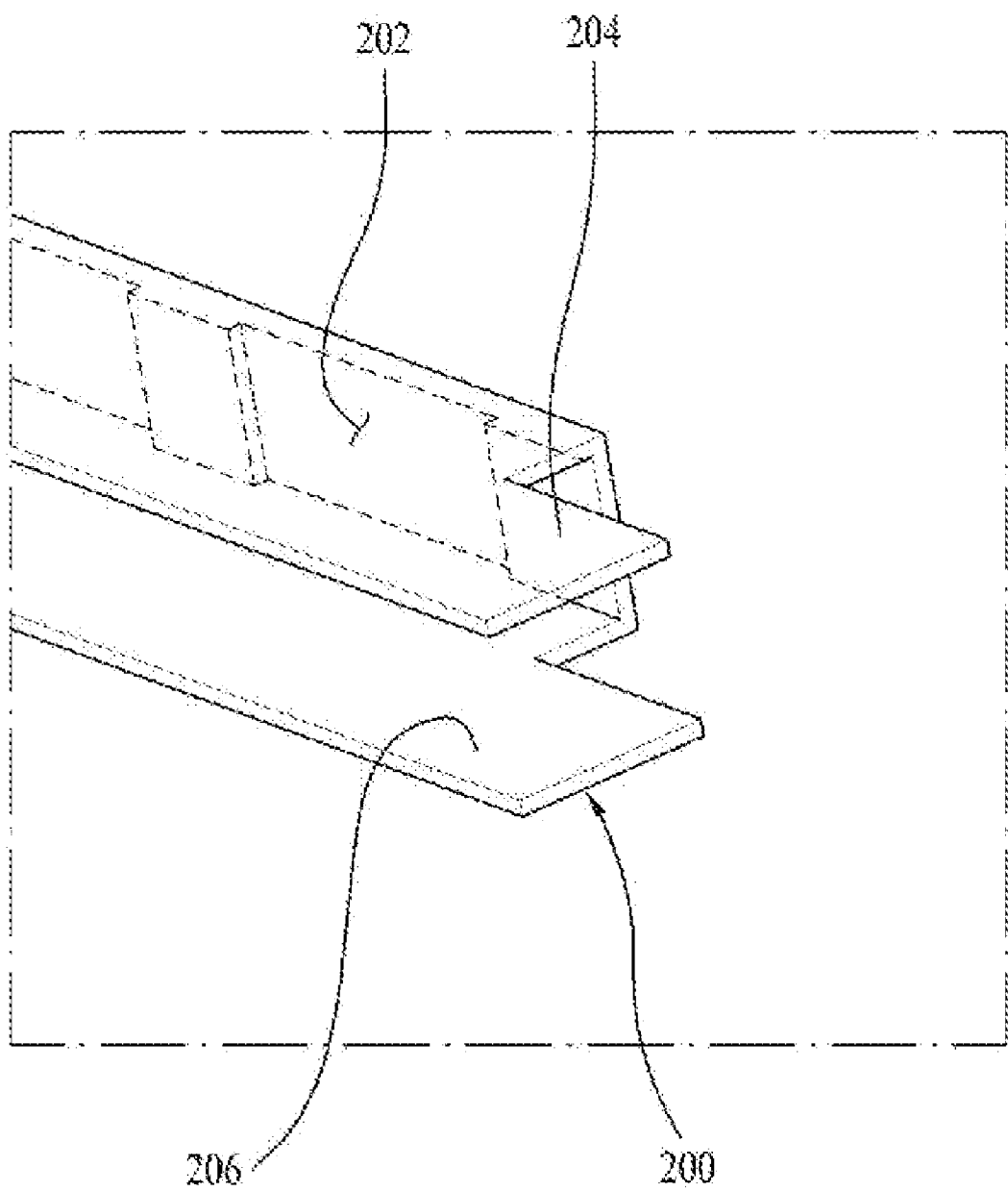
FIGS. 8A to 8C illustrate perspective views for describing an LED placed in an LED cover in FIG. 7.
Figure 8B:
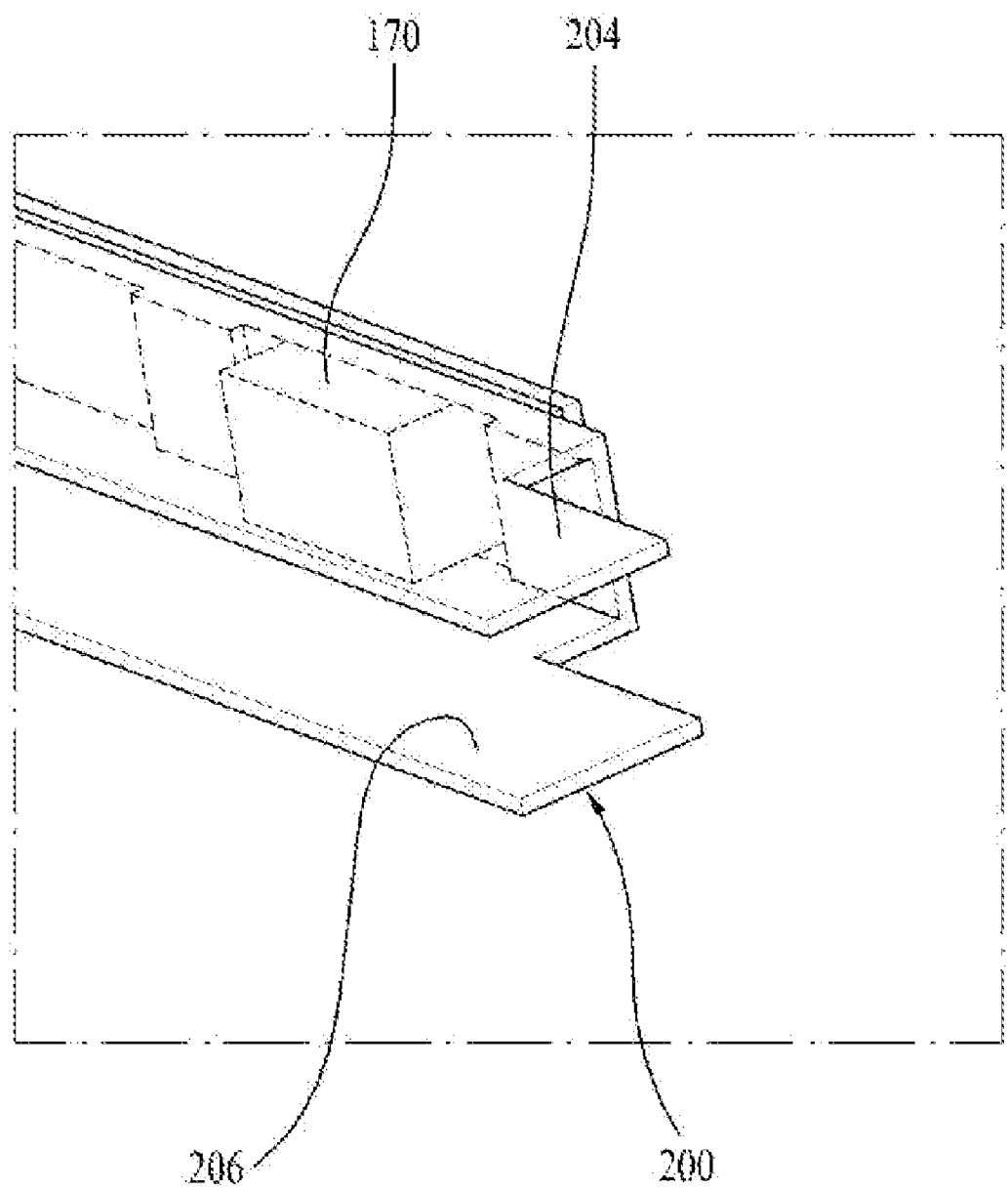
Figure 8C:
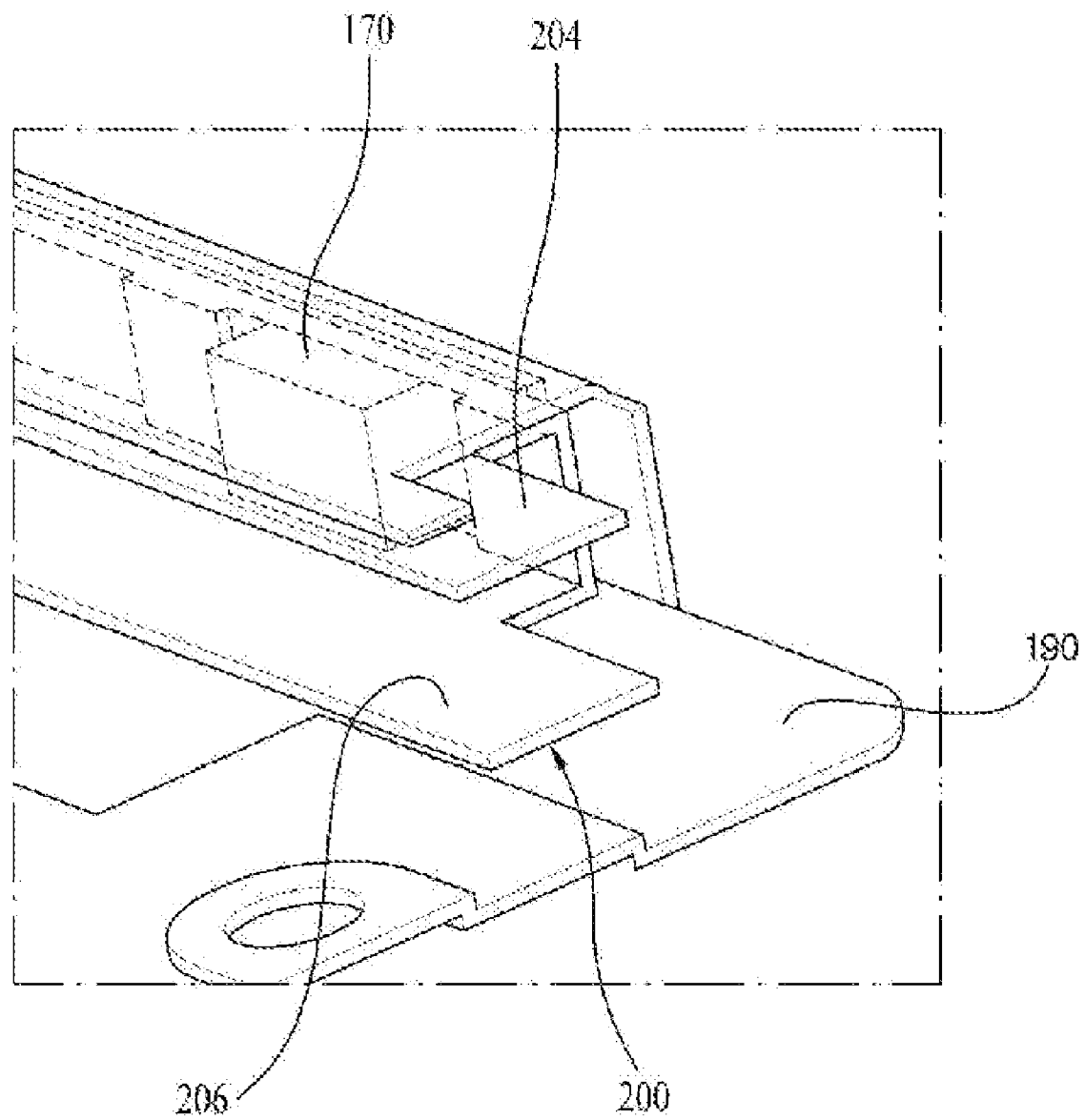

FIG. 7 illustrates a section of a light source unit in accordance with a second preferred embodiment of the present invention, and FIGS. 8A to 8C illustrate perspective views for describing an LED placed in an LED cover in FIG. 7.

The liquid crystal display device in accordance with the second preferred embodiment of the present invention is identical to the liquid crystal display device in accordance with the first preferred embodiment of the present invention, except the light source unit, detailed description of other units except the light source unit will be omitted, and FIGS. 2 and 3 will be used for drawings on the LED flexible substrate.

The light source unit in accordance with the second preferred embodiment of the present invention includes an LED 170 for emitting a light, an LED flexible substrate 160 for fixedly securing the LED 170, and an LED cover 200 formed to surround the LED 170.

A plurality of the LEDs 170 are arranged on the LED flexible substrate 160 on a line to face the light guide plate 140, for providing the light to the liquid crystal display panel 120.

The LED flexible substrate 160 includes first and second flat portions 162 and 164, and a seating portion 166 perpendicular to the first and second flat portions 162 and 164, to form a flexible printed circuit FPC. The seating portion 166 has a plurality of the LEDs 170 mounted on a line, the first flat portion 162 has an inverter connected thereto for having driving power applied thereto for driving the LEDs 170, and the second flat portion 164 has wiring for LED driving signals and heat dissipation.

The LED flexible substrate 160 has the first and the second flat portions 162 and 164 and the seating portion 166 bent perpendicular to each other. A contact line between the first and second flat portions 162 and 164 and the seating portion 166 is half cut 168 for easy bending.

The first flat portion 162 is bent into a "C" shape and has a connector 172 for connection to the inverter. The second flat portion 164 is bent to have a length the same with the seating portion 166 having the plurality of LEDs 170 formed thereon. The first and second flat portions 162 and 164, not only form a driving signal, but also have a pattern of copper or the like for fast dissipation of heat from the LEDs 170.

Referring to FIG. 7, the LED flexible substrate 160 has the seating portion 166 formed in the bottom chassis 190, and the second flat portion 164 passed through the bottom chassis 190 and formed on an outside, or formed in the bottom chassis 190 alike the first embodiment.

The LED cover 200 is formed of a material having a high reflectivity to reflect the light from the LED 170 toward the light guide plate 140, thereby improving light reflection efficiency. The LED cover 200 fixes the LEDs 170 thereto, and formed to surround the LEDs 170. The LED cover 200 has a side, and first and second covers 204 and 206 to surround the LEDs 170 mounted to the LED flexible substrate 160 in a C shape. The first and second covers 204 and 206 are formed opposite to each other with the side of the LED cover 200 disposed therebetween. As shown in FIGS. 8A to 8C, the side has a hole 202 at a position matching to the LED 170 on the LED flexible substrate 160 for placing the LED 170 therethrough. The hole 202 has a size for placing LED 170 therethrough. The LED cover 200 has the first and second covers 204 and 206 formed on an upper side and a lower side of the LED 170 perpendicular to the side such that the first and second covers 204 and 206 cover the upper side and the lower side of the LED 170 placed through the side.

By placing the LED 170 through the hole 202 in the side of the LED cover 200, the LED cover 200 can secure the LED 170 closely. By placing the LEDs 170 close to an inside of the bottom chassis 190, enabling to secure a space in a range of 0.1~0.3 mm, hot spot can be prevented. Moreover, a heat dissipation tape 210 is attached between the bottom chassis 190 and the seating portion 166 of the LED flexible substrate 160 for quick dissipation of heat from the LEDs 170.

On the other hand, instead of formation of the hole 202 in the side of the LED cover 200 for placing the LED 170 therethrough, the LED 170 may be formed on the side.

As has been described, the liquid crystal display device of the present invention has the following advantages.

The liquid crystal display device of the present invention has an LED flexible substrate of a flexible circuit film including a seating portion for mounting the LED thereto, and first and second flat portions bent perpendicular to the seating portion having wirings for a driving signal for driving the LED and dissipating heat from the LED. According to this, since no bonding is required for supplying a driving signal, bonding process defects which is liable to take place, and additional expense required for the bonding does not take place. The first and second flat portions of the LED flexible substrate which expands an area not to limit a width enables to form, not multiple layers, but two or below two layers.

The formation of the LED flexible substrate as a flexible printed circuit enables to form lines thinner, and the large areas of the first and second flat portion permits to have good heat dissipation effect.

The LED cover having a hole for placing the LED mounted to the LED flexible substrate therethrough permits to prevent hot spot since the LED can be placed close to an inside of the bottom chassis through the hole in the LED cover. Moreover, even if no reflective coating is applied to a surface of the LED flexible substrate for enhancing reflectivity, the LED cover having high reflectivity can improve light efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display device comprising:
   a liquid crystal display panel;
   an LED for providing a light to the liquid crystal display panel;
   an LED flexible substrate having a seating portion for mounting the LED thereto, and first and second flat portions bent from the seating portion perpendicular thereto respectively, to form a flexible printed circuit (FPC);
   a bottom chassis configured to have a C shape for surrounding the LED; and
   a mold frame for surrounding the LED and the LED flexible substrate;
   wherein the mold frame has a space for leading the first flat portion to an outside for connection to an inverter,
   wherein the second flat portion is bent to have a length the same with the seating portion.

2. The liquid crystal display device as claimed in claim 1, wherein the first flat portion is bent from the seating portion perpendicular thereto, and connected to the inverter for connection to a driving power for driving the LED.

3. The liquid crystal display device as claimed in claim 1, wherein the second flat portion is bent from the seating portion perpendicular thereto, and includes a line for a driving signal for driving the LED and dissipating heat from the LED.

4. The liquid crystal display device as claimed in claim 1, wherein a contact line between the seating portion and the first and second flat portions perpendicular to the seating portion is half cut.

5. The liquid crystal display device as claimed in claim 1, wherein the LED flexible substrate is coated with a reflective material having high reflectivity.

6. The liquid crystal display device as claimed in claim 1, further comprising an LED cover of a material of high reflectivity having a hole for placing the LED mounted to the LED flexible substrate therethrough.

7. The liquid crystal display device as claimed in claim 6, wherein the LED cover includes;
   a side having the hole formed therein for holding the LED mounted to the LED flexible substrate passed therethrough, and
   first and second covers formed perpendicular to the seating portion to surround an upper side and a lower side of the LED.

8. The liquid crystal display device as claimed in claim 6, wherein the bottom chassis surrounds the LED, the LED flexible substrate, and the LED cover, and supporting the same from undersides thereof.

9. The liquid crystal display device as claimed in claim 8, further comprising a heat dissipation tape attached between the bottom chassis and the seating portion of the LED flexible substrate for quick dissipation of heat from the LED.

* * * * *